United States Patent [19]
Fujii et al.

[11] Patent Number: 5,939,132
[45] Date of Patent: *Aug. 17, 1999

[54] ALIGNMENT CHIPS POSITIONED IN THE PERIPHERAL PART OF THE SEMICONDUCTOR SUBSTRATE AND METHOD OF MANUFACTURING THEREOF

[75] Inventors: Toyokazu Fujii; Mikio Nishio; Mitsuru Sekiguchi; Kazuhiko Hashimoto, all of Osaka, Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/833,193

[22] Filed: Apr. 14, 1997

Related U.S. Application Data

[63] Continuation of application No. 08/420,873, Apr. 13, 1995, abandoned, which is a continuation of application No. 08/114,144, Sep. 1, 1993, Pat. No. 5,451,261.

[30] Foreign Application Priority Data

Sep. 11, 1992 [JP] Japan ................................. 4-242907

[51] Int. Cl.$^6$ .............................. B05D 5/12; H07L 21/301
[52] U.S. Cl. .............................. 427/97; 427/99; 427/124; 427/282; 427/250; 427/255; 438/462; 438/975
[58] Field of Search ................................ 427/97, 99, 124, 427/259, 282, 250, 255; 437/924, 195, 245; 148/DIG. 102; 257/797; 438/462, 975

[56] References Cited

U.S. PATENT DOCUMENTS

| | | | |
|---|---|---|---|
| 4,125,418 | 11/1978 | Vinton | 148/DIG. 102 |
| 4,468,857 | 9/1984 | Christian et al. | 148/DIG. 102 |
| 4,599,970 | 7/1986 | Peterson | 118/504 |
| 4,661,228 | 4/1987 | Mintz . | |
| 4,919,076 | 4/1990 | Lutz | 118/721 |
| 4,963,423 | 10/1990 | Sekiguchi | 428/209 |
| 5,277,749 | 1/1994 | Griffith et al. | 156/643 |
| 5,362,681 | 11/1994 | Roberts, Jr. et al. | 437/924 |

FOREIGN PATENT DOCUMENTS

| | | |
|---|---|---|
| 144126 | 8/1984 | Japan . |
| 189629 | 10/1984 | Japan . |
| 224224 | 11/1985 | Japan . |
| 64(1)-11966 | 1/1989 | Japan . |
| 64(1)-74739 | 3/1989 | Japan . |

*Primary Examiner*—Brian K. Talbot
*Attorney, Agent, or Firm*—McDermott, Will & Emery

[57] ABSTRACT

On a semiconductor substrate, chips to be products and alignment chips located at a portion a part thereof is left out from a peripheral part of the semiconductor substrate are formed. Contact holes and alignment marks are formed at the chips to be products and the alignment chips. Covering the alignment chips with alignment mark cover parts of a substrate holder, a material for metal wiring is deposited on the semiconductor substrate to form a metal film on the substrate. A mask pattern is formed on the metal film using the alignment marks of the alignment chips on which the metal film is not formed.

9 Claims, 8 Drawing Sheets

ALIGNMENT CHIPS POSITIONED IN THE PERIPHERAL PART OF THE SEMICONDUCTOR SUBSTRATE AND METHOD OF MANUFACTURING THEREOF

This is a continuation of application Ser. No. 08/420,873 filed Apr. 13,1995, now abandoned which is a continuation of application Ser. No. 08/114,144, filed Sep. 1, 1993 now U.S. Pat. No. 5,451,261.

BACKGROUND OF THE INVENTION

This invention relates to a metal film deposition method and a metal film deposition apparatus used therein, and particularly relates to those for depositing a metal film entirely on a semiconductor substrate at which contact holes and alignment marks are formed.

In a semiconductor device in which a metal wiring of an under-layer is formed on a semiconductor substrate via an insulating film, or a semiconductor device in which a metal wiring of an upper-layer is formed on the metal wiring of the under-layer via an insulating film interlaid between layers, an active region on the substrate and the metal wiring of the under-layer or the metal wiring of the under-layer and the metal wiring of the upper-layer are connected by a metallic material deposited in contact holes formed at the insulating film or the interlaid insulating film. When a metal film is patterned to be the metal wiring by etching, alignment marks concurrently formed with the contact holes at the insulating film or the interlaid insulating film are aligned with alignment marks of a mask for metal wiring formation, so that the alignment accuracy of the contact holes and the metal wiring is ensured.

Though the alignment marks are formed by depositing the material for metal wiring on the contact holes according to the general sputtering method, the alignment marks remain uneven. Therefore it is impossible to optically recognize the alignment marks.

As the semiconductor device becomes highly integrated and has high density, an aspect ratio of the contact holes becomes large. As a result, the metal film at a bottom part of each contact hole shall be extremely thin when the material for metal wiring is deposited in the contact holes according to the ordinary sputtering method. This involves a problem that contact resistances are dispersed, lowering a reliability of the contact.

Recently, proposed in Japanese Patent Application Laying Open Gazettes No.63-24054 and No.64-11966 is a high-temperature sputtering method in which temperature of the semiconductor substrate is made high at deposition of the material for metal wiring by sputtering and the material for metal wiring to be deposited on the substrate is flowed in the contact holes. This enable to fill the material for metal wiring in the contact holes without failure.

According to the high-temperature sputtering method, the material for metal wiring is filled in the contact holes without failure and the metal film is flattened. However, the material for metal wiring is further filled in the alignment marks formed at the insulating film or the interlaid insulating film. As a result, the uneven surfaces of the alignment marks are flattened so as to be recognized optically. Hence, when a mask for wiring formation is formed to the metal film, the alignment marks formed in the insulating film or the interlaid insulating film cannot be aligned with the mask for wiring formation.

Accordingly, this requires a process of exposing specific alignment marks used at the mask for wiring formation out of the alignment marks by partially etching the metal film formed on the insulating film or the interlaid insulating film.

SUMMARY OF THE INVENTION

This invention has its object of making the process of exposing, by etching, the specific alignment marks used at the mask pattern formation on the metal film out of the alignment marks unnecessary, even though the metal film deposition method such as the high-temperature sputtering method is applied in which the material for metal wiring is filled and flattened in the alignment marks.

A metal film deposition apparatus according to the present invention comprises: substrate holding means for holding a semiconductor substrate; peripheral part cover means for covering a peripheral part of the semiconductor substrate held by the substrate holding means; metal film forming means for forming a metal film on the semiconductor substrate by depositing a material for metal wiring on the semiconductor substrate which is held by the substrate holding means and the peripheral part of which is covered with the peripheral part cover means, wherein the peripheral part cover means includes alignment mark cover means for covering specific alignment marks used at a mask pattern formation on the metal film out of alignment marks formed on the semiconductor substrate.

Hence, when the metal film is formed on the substrate by depositing the material for metal wiring thereon in such a fashion that the specific alignment marks are covered with the alignment mark cover means, the material for metal wiring is filled in the contact holes on the substrate and is not filled in the specific alignment marks.

Accordingly, even though the metal film deposition method in which the contact holes are filled without failure is applied, the etching process of exposing the specific alignment marks is unnecessary. Therefore, contacts with no dispersion and high reliability are obtained without complicated processes.

The metal film deposition apparatus preferably comprises substrate position control means for detecting a position of an orientation flat formed on the semiconductor substrate and for moving the semiconductor substrate based on the detected position of orientation flat so as to accord positions of the specific alignment marks with positions of the alignment mark cover means.

Accordingly, the positions of the alignment mark cover means are adjusted to the position of the specific alignment marks.

Preferably, the peripheral part cover means is formed integrally with the substrate holding means, because, the process for holding the substrate and covering the peripheral part of the substrate is facilitated.

As the metal film forming means, sputtering means or CVD means can be used. As the material for metal wiring, aluminum, tungsten or titanium can be used.

A method of depositing a metal film comprises the steps of: an alignment mark forming step of forming alignment marks on a semiconductor substrate at the same time with a formation of contact holes; and a metal film forming step of forming a metal film on the semiconductor substrate by depositing a material for metal wiring on the semiconductor substrate, wherein the metal film forming step is conducted in such a fashion that specific alignment marks used at a mask pattern formation on the metal film out of alignment marks on the semiconductor substrate are covered with alignment mark cover means.

Preferably, the metal film forming step in the metal film deposition method includes the step of: detecting a position of an orientation flat formed on the semiconductor substrate and moving the semiconductor substrate based on the detected position of the orientation flat so as to accord positions of the specific alignment marks with positions of alignment mark cover means before the specific alignment marks are covered with the alignment mark cover means.

Preferably, the metal film forming step in the metal film deposition method includes the step of specifying alignment marks formed at a chip partially missed from a peripheral part of the semiconductor substrate as the specific alignment marks before the specific alignment marks are covered with the alignment mark cover means.

DETAILED DESCRIPTION OF THE PREFERRED EMBODIMENT

Description is made below about an embodiment of the present invention, with reference to accompanying drawings.

Figure 1:
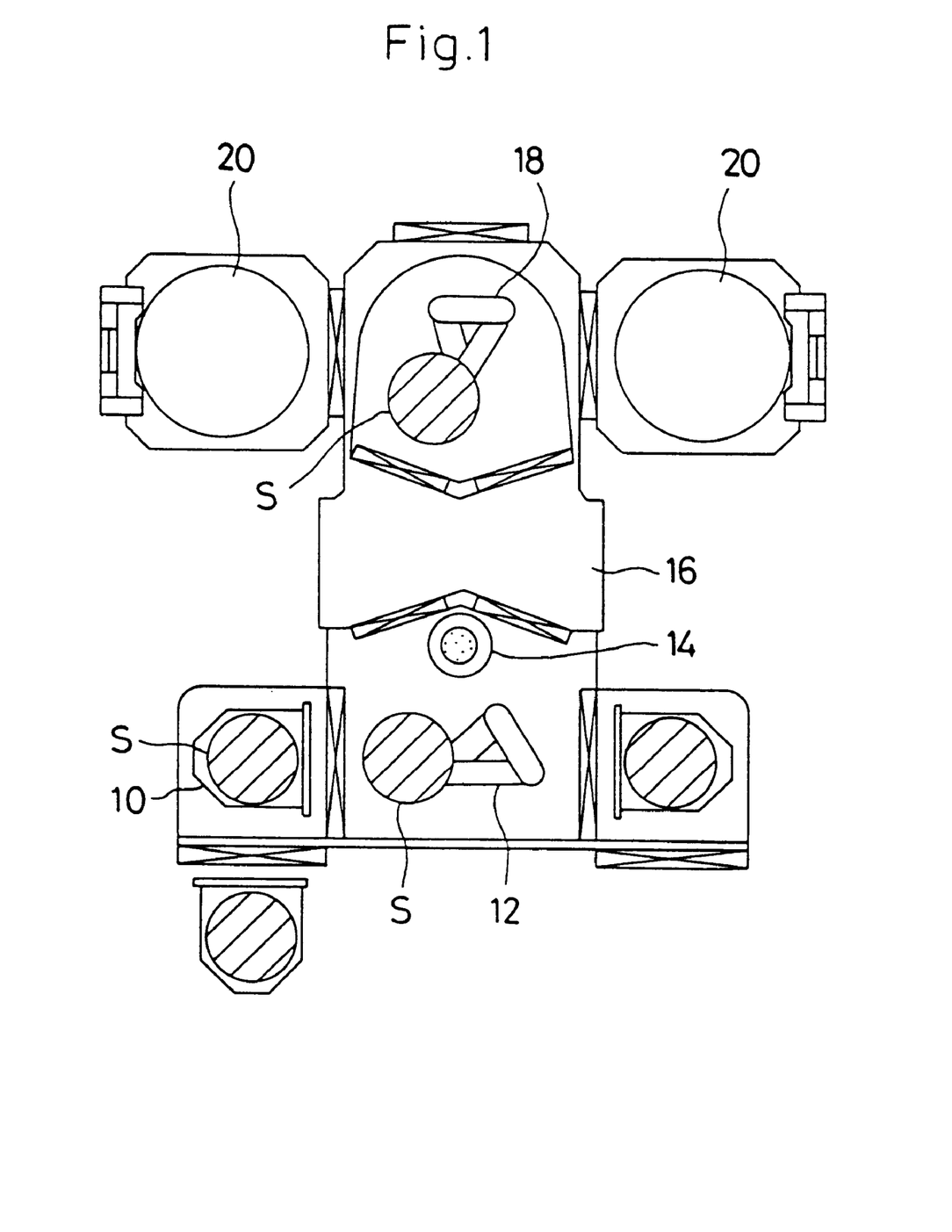
FIG. 1 is a schematic plan view showing a whole construction of a metal film deposition apparatus according to an embodiment of the present invention.

FIG. 1 shows a whole construction of a metal film deposition apparatus according to the embodiment of the present invention. A semiconductor substrate S housed in a cassette box 10 is taken out of the cassette box 10 by a first robot 12, then a position thereof is controlled by substrate position control means 14. The control for substrate position by the substrate position control means 14 is described later.

The substrate S whose position is controlled by the substrate position control means 14 is transferred to a load-lock chamber 16 by the first robot 12. The substrate S transferred to the load-lock chamber 16 is cooled down therein when it is already heated and is preheated therein when it is to be heat-treated at a next process. The substrate cooled down or preheated in the load-lock chamber 16 is transferred by a second robot 18 from the load-lock chamber 16 to a process module 20 in which sputtering or CVD is conducted.

Figure 2:
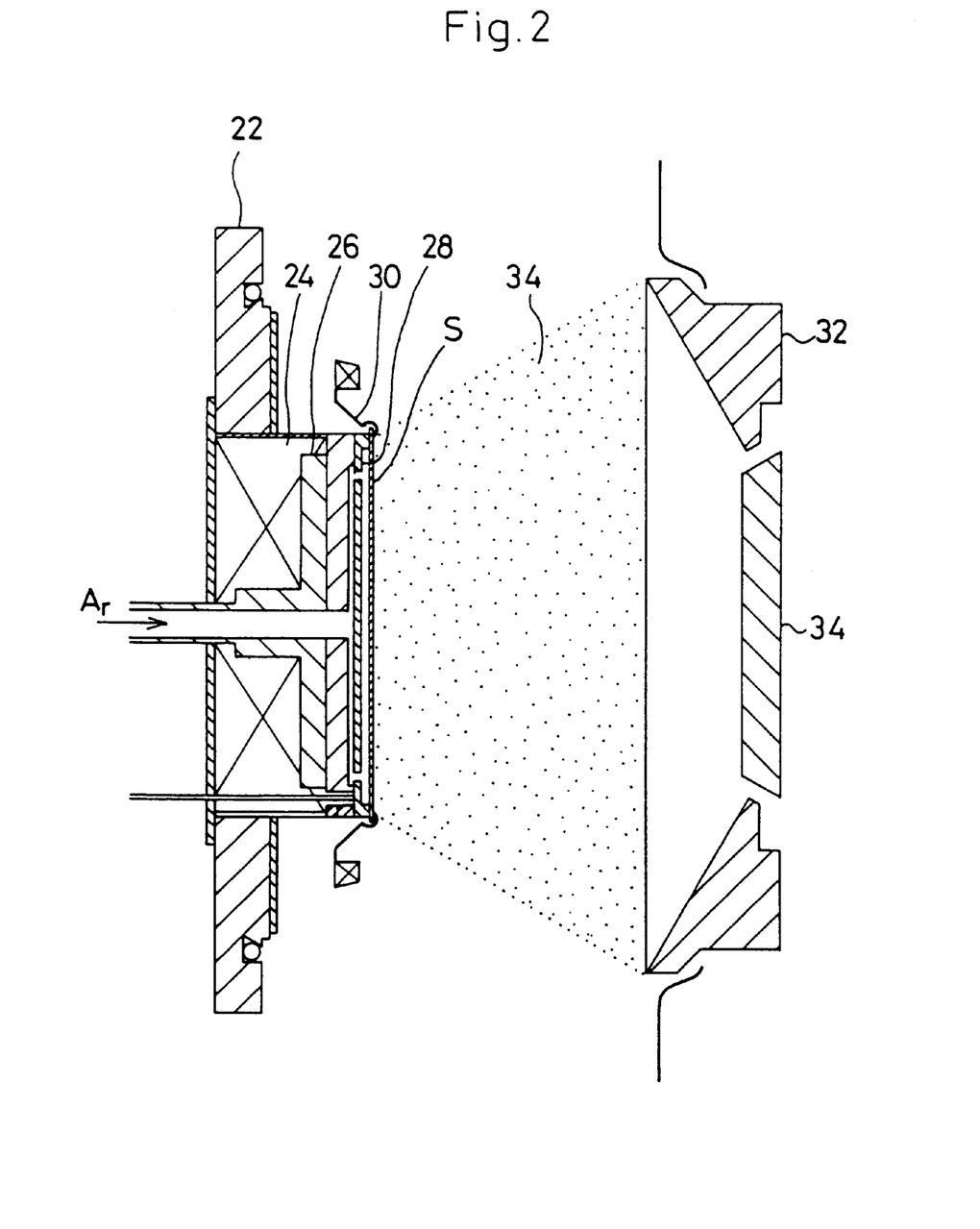
FIG. 2 is a section showing a sputtering apparatus as the metal film deposition apparatus.

FIG. 2 shows a sputtering apparatus for conducting sputtering in the process module 20. A heater element 26 is held to a main body 22 via an insulator 24 and a heater block 28 is provided at the heater element 28. The heater element 26 and the heater block 28 composes substrate holding means. The substrate S is clipped by the heater block 28 and a spring clip 30 as peripheral part cover means integrally formed with the heater element 26. In FIG. 2, reference numeral 32 indicates a cathode as a target. 34 is an anode. Argon gas as discharge gas which is introduced into the chamber is made plasma by the cathode 32 and the anode 34, and argon ions 34 in the plasma impact against a surface of the target on the cathode 32 to hit out target atoms. The cathode 32, the anode 34, and the discharge gas composes metal film forming means.

Figure 3:
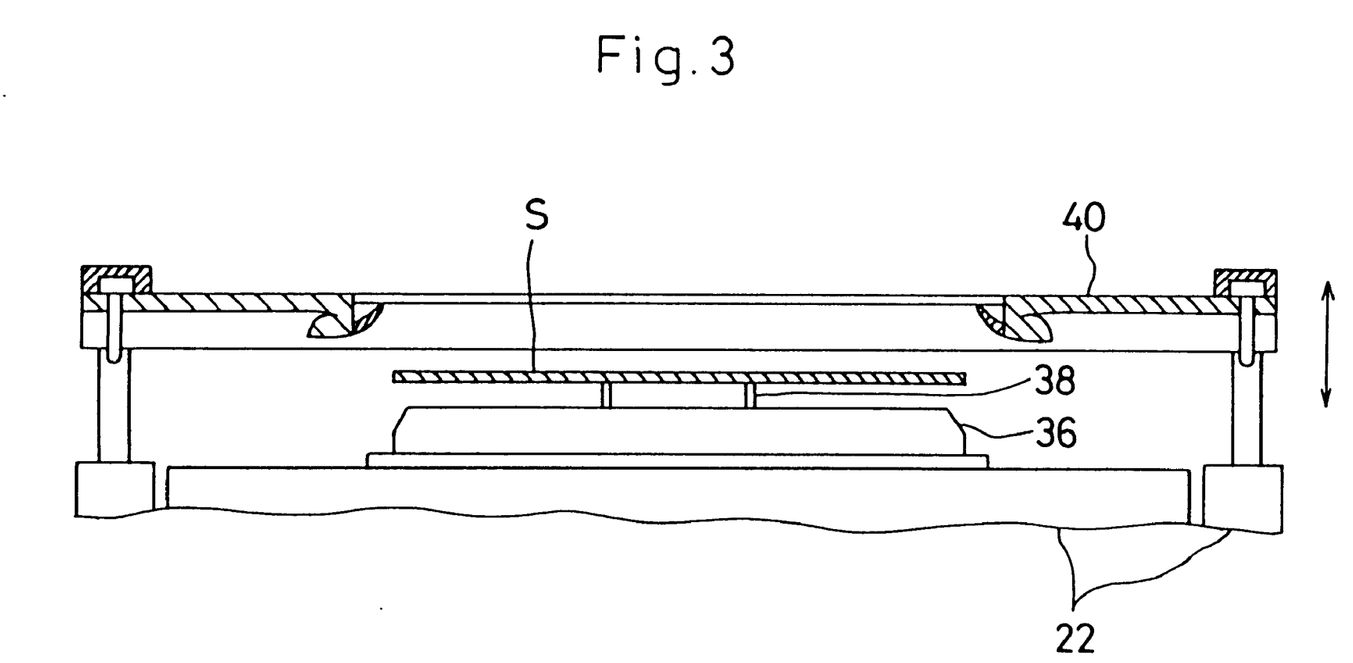
FIG. 3 is a section showing a modified example of substrate holding means and peripheral part cover means in the sputtering apparatus.

FIG. 3 shows a modified example of the sputtering apparatus. A support table 36 is provided on the main body 22 and a pin member 38 capable of advancing and retreating is provided on the support table 36. The support table 36 and the pin member 38 compose substrate holding means. The pin member 38 is normally put in the support table 36. When the substrate S is placed on or removed from the support table 36, the pin member 38 advances from the support table 36 to push up the substrate S so that a robot (not shown) can easily clip the substrate S. An annular substrate holder 40 as peripheral part cover means is vertically movably provided at the main body 22. When the substrate holder 40 moves downward, the substrate S is clipped by the substrate holder 40 and the support table 36, and a peripheral part of the substrate S is covered with the substrate holder 40.

Figure 4:
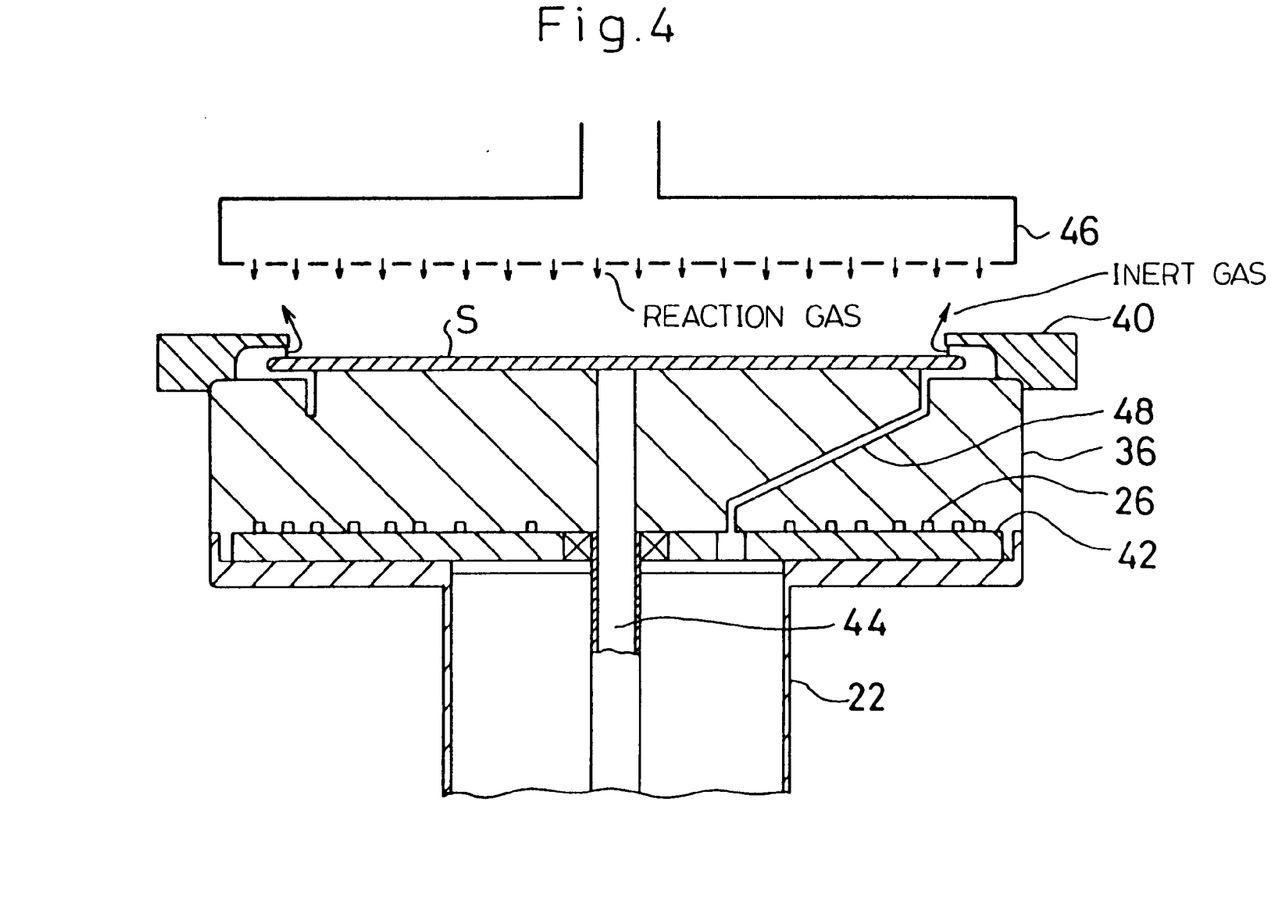
FIG. 4 is a section showing a CVD apparatus as the metal film deposition apparatus.

FIG. 4 shows a CVD apparatus for conducting CVD in the process module 20. The support table 36 as holding means is provided at the main body 22 via a heat-insulator 42, and is heated by the heating element 26. The substrate S placed on and held by the support table 36 is covered at the peripheral part thereof with the annular substrate holder 40 as peripheral part cover means. A vacuum passage 44 passes through the respective center parts of the main body 22 and the support table 36. The chamber is vacuumed through the vacuum passage 44. A shower head 46 is provided above the support table 36 for supplying reaction gas to a surface of the substrate S. In this case, in order to prevent the reaction gas from getting in the peripheral part of the substrate S, inert gas supplied from an inert gas passage 48 provided at the support table 36 is supplied to the peripheral part of the substrate S from a slit between the support table 36 and the substrate holder 40.

Figure 5:
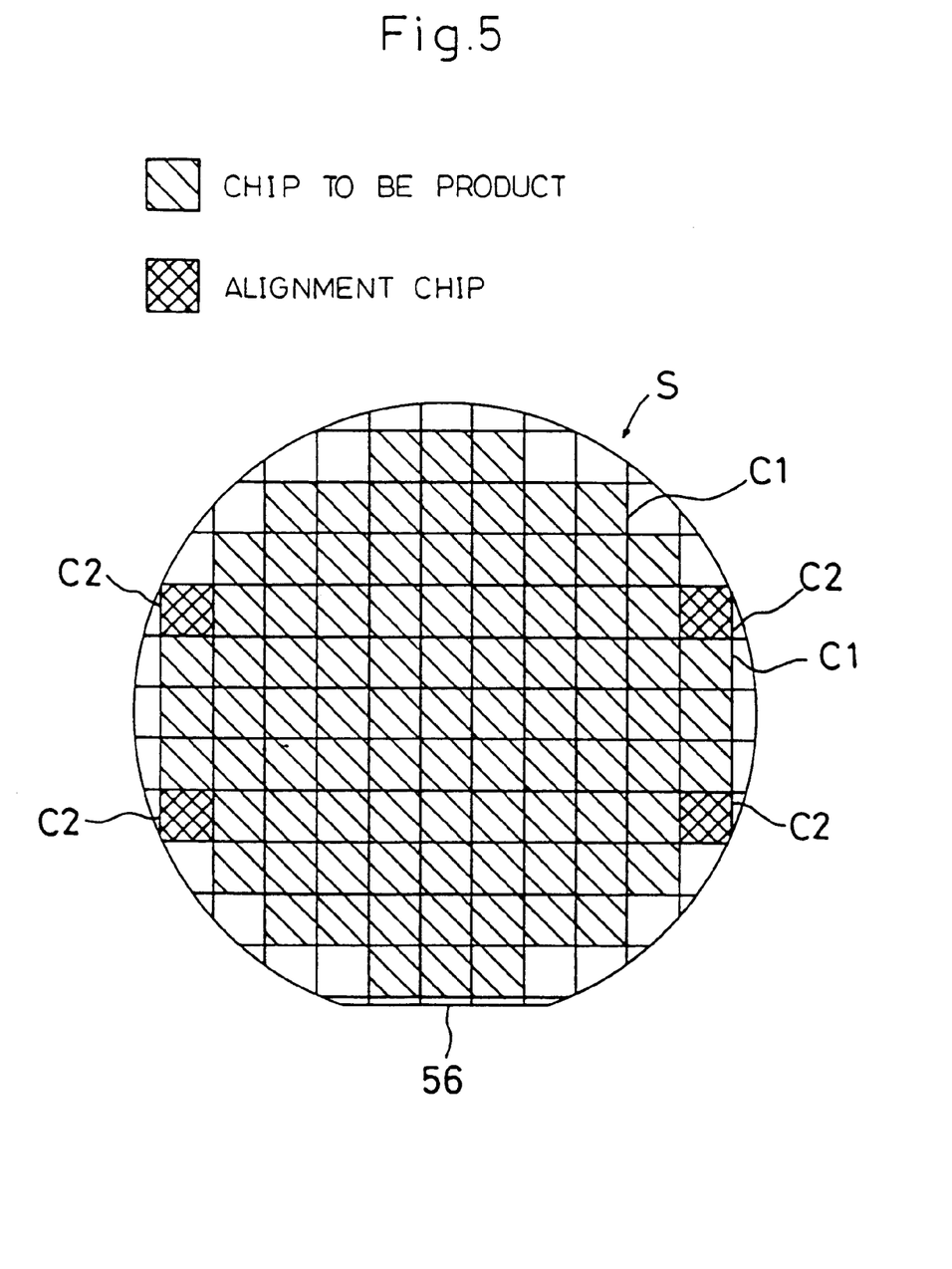
FIG. 5 is an exposure map showing an arrangement of chips to be products and chips only for alignment which are formed on the substrate.
Figure 6:
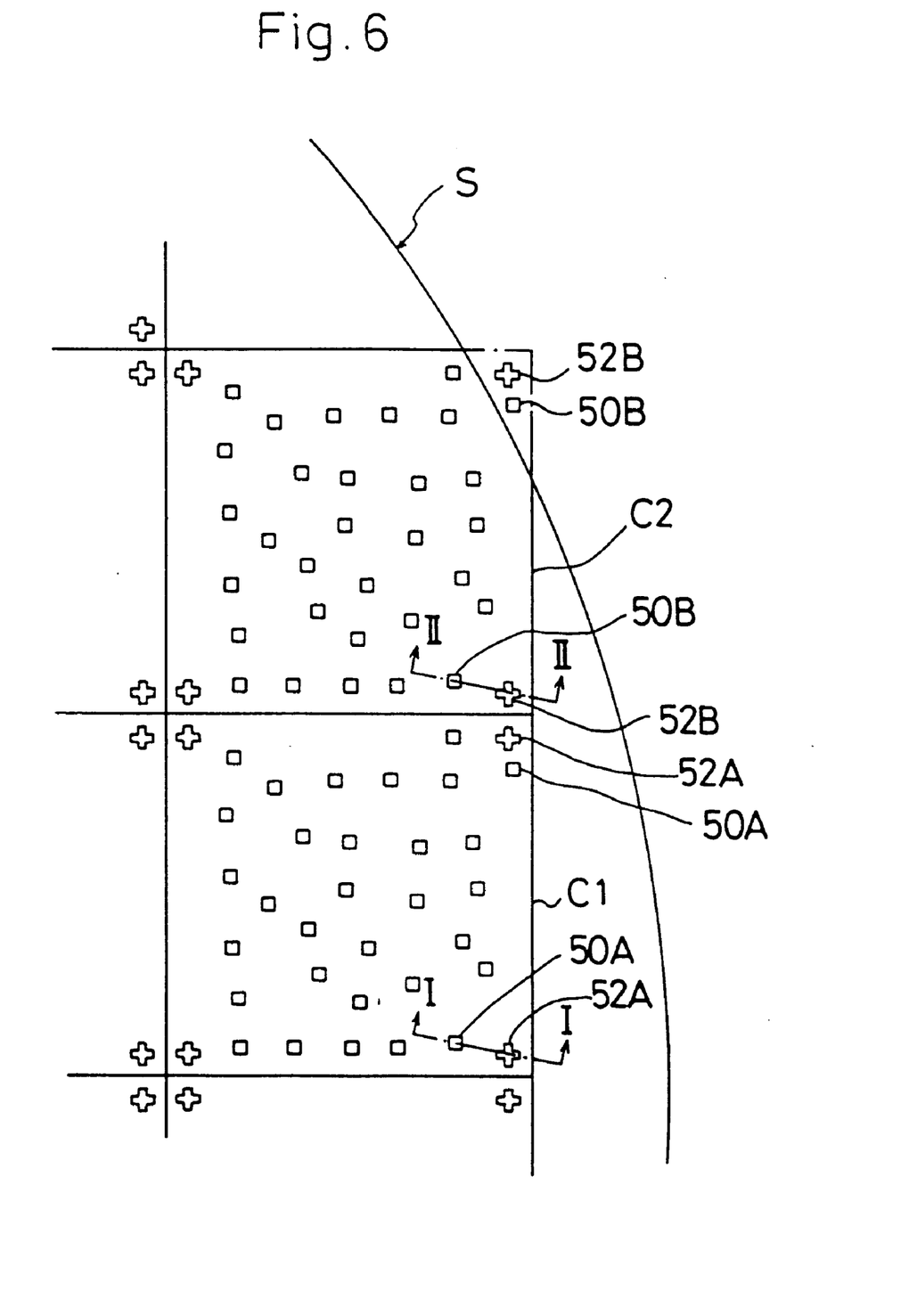
FIG. 6 is an enlarged segmentary view of the exposure map in FIG. 5.

FIG. 5 is an exposure map showing an arrangement of chips C1 to be products and chips C2 only for alignment which are formed on the substrate S. FIG. 6 is an enlarged detail of a part thereof. In the conventional alignment method, since all of alignment marks are recognized, several chips are used for alignment out of the chips C1 to be products. Meanwhile, in this embodiment, four chips arranged at four points of the peripheral part of the substrate S and partially missed from the peripheral part are specified to be the alignment chips C2. Since the substrate is in the form of a circle and the chips are square, the chips at the peripheral part of the substrate S are partially missed, so that the chips which cannot perform a function as the chip C1 to be a product are generated though the chips are exposed. Accordingly, the chips which cannot perform the function are used as the alignment chips C2. In general, for reducing time required for exposure, the chips having one part which is missed are not exposed. However, in this embodiment, such chips are exposed for using as the alignment chips C2.

Recently, a generally used exposure method in a photo process is that the exposure is conducted per chip, using an exposure apparatus having an alignment function, as shown in the exposure map in FIG. 5. At this time, all the chips C1, C2 have the same pattern and contact holes 50A, 50B and alignment marks 52A, 52B are formed to the patterns. Normally, the contact holes 50A, 50B are about 1 μm and the alignment marks 52A, 52B are about 10 μm, but the scale in FIG. 6 is ignored for convenience' sake.

The alignment marks formed at each chip are used for pattern alignment in the photo process. In general, the alignment marks of every chip on the substrate S are not used. In other words, all chips are aligned using the exposure apparatus based on some alignment marks (at least four marks) for setting position in X and Y directions. The present invention utilizes the alignment marks of not all chips on the substrate S for the alignment in the photo process, and only the alignment marks 52B of the alignment chips C2 are used.

Figure 7:
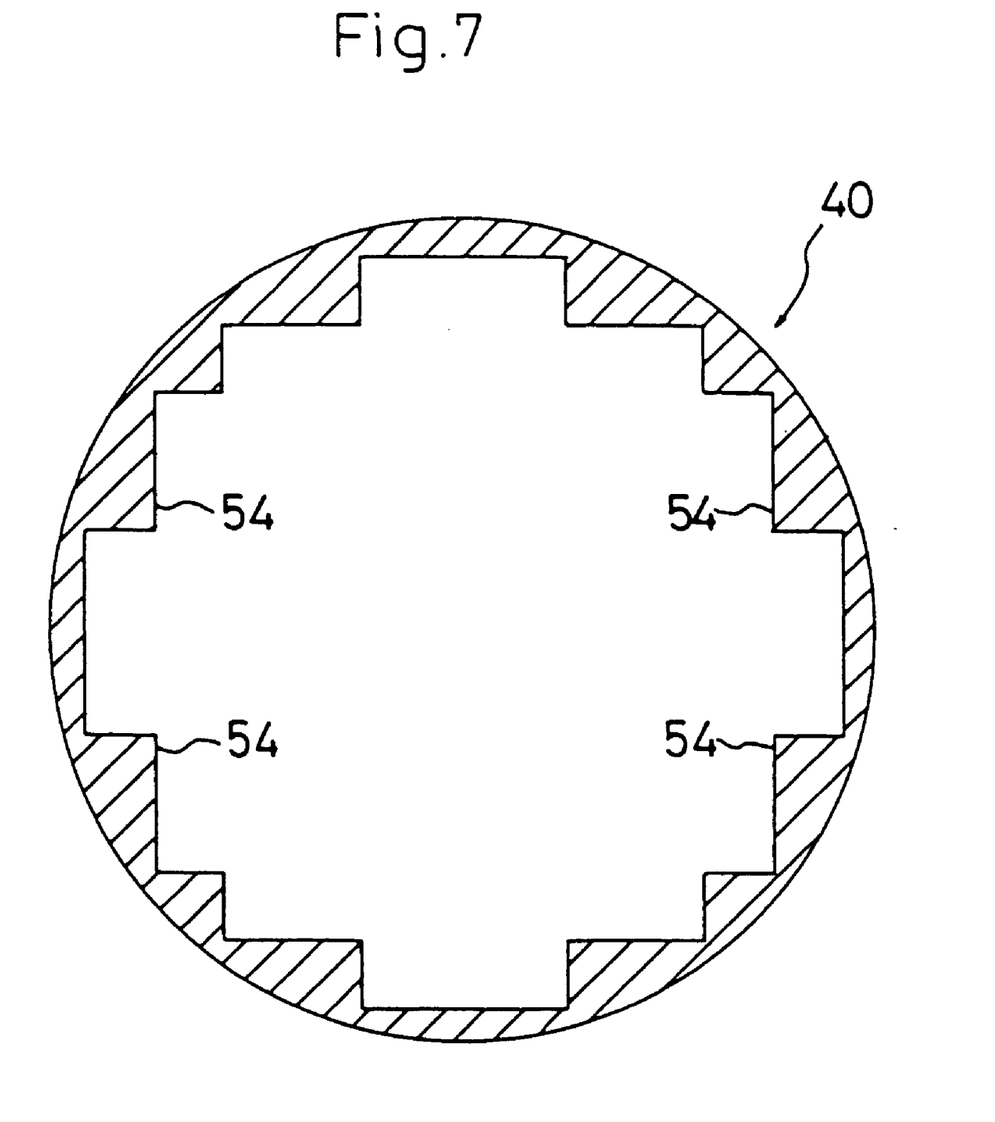
FIG. 7 is a plan view of a substrate holder used in the metal film deposition apparatus.

FIG. 7 is a plan view showing a construction of an example of the substrate holder 40 used in the above metal film deposition apparatus. As shown in FIG. 7, the substrate holder 40 is shaped for covering the peripheral part of the substrate S and has alignment mark cover parts 54 projecting toward the center of the substrate S so as to cover the alignment chips C2. A gap is formed between the alignment mark cover parts 54 of the substrate holder 40 and the substrate S, considering entering of the metal film, e.g. aluminum film formed on the substrate S thereunder and displacement of the substrate holder 40 and the alignment to mark 52.

Discussed next is a method for controlling the substrate position by the substrate position control means 16. The substrate position control means 16 detects a position of an orientation flat 56 (see FIG. 5) formed in the substrate S, and rotates and moves the substrate S based on the detected position of the orientation flat so that the positions of the alignment marks 52 of the alignment chips C2 accord with the positions of the alignment mark cover parts 54.

Described below is a method of depositing a metal film on the substrate S, using the above metal film deposition apparatus.

Figure 8A:
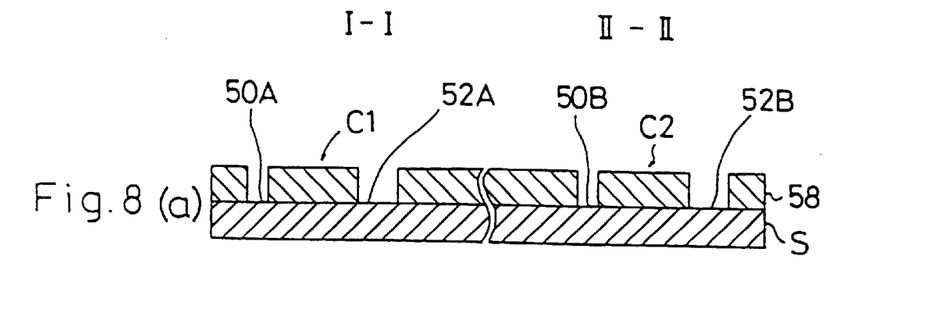
FIGS. 8(a), 8(b) and 8(c) are sections respectively taken along I—I and II—II in FIG. 6 and show respective processes of a metal film deposition method according to an embodiment of the present invention.
Figure 8B:
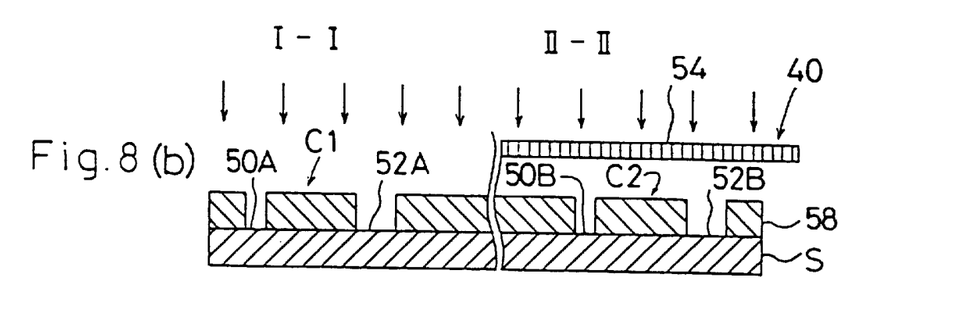
Figure 8C:
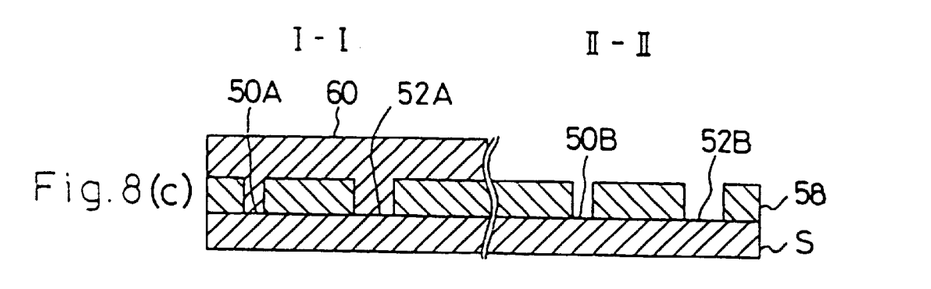

FIGS. 8(*a*), 8(*b*) and 8(*c*) are sections showing respective processes in the metal film deposition method, and illustrating sections taken along I—I and II—II in FIG. 6 for comparison.

First, as shown in FIG. 8(*a*), the contact holes 50A, 50B and the alignment marks 52A, 52B are formed concurrently at an insulating film 58 formed on the chips C1 to be products and the alignment chips C2 of the substrate S.

Next, as shown in FIG. 8(*b*), covering the alignment chips C2 with the alignment mark cover parts 54 of the substrate holder 40, a material for metal wiring, e.g. aluminum is deposited on the substrate S according to a known metal film deposition method such as high-temperature sputtering method, CVD method. As a result, as shown in FIG. 8(*c*), a flat metal film 60 made of aluminum is formed on the substrate S.

Subsequently, after a resist is coated on the metal film 60 to form a resist film (though not shown), a mask pattern for making the metal film 60 a wiring is formed at the resist film. In this case, a mask for wiring is aligned using the alignment marks 52B of the alignment chips C2. Wherein, a mask pattern is unnecessary to form on the alignment chips C2. Then, the metal film 60 is etched using the mask pattern to be a metal wiring.

In so doing, the material for metal wiring is filled in the contact holes 52A and the alignment marks 50A of the chips C1 to be products but is unfilled in the contact holes 50B and the alignment marks 52B of the alignment chips C2. Consequently, a process of exposing the alignment marks for aligning the mask for wiring is unnecessary, thus reducing manufacturing processes. In addition, since the material for metal wiring is filled in the contact holes 50A of the chips C1 to be products without failure so as to form a flat metal film, a contact with less dispersion and high reliability is obtained.

In the above embodiment, the alignment mark cover parts 54 of the substrate holder 40 entirely cover the alignment chips C2. However, the alignment mark cover parts 54 may cover only the alignment marks 52B used for alignment of the alignment chips C2. Also, in the above embodiment, the alignment marks are provided within the chip. However, the positions of the alignment marks are not limited and may be formed at scribed lines of about 100 μm. In this case, the alignment mark cover parts 54 of the substrate holder 40 cover the scribed line at which the alignment marks are formed, instead of chips.

Further, in the above embodiment, the alignment chips C2 are set to four points at the peripheral part of the substrate S. With a large diameter semiconductor chips, the alignment chips C2 are set to six or eight points at the peripheral part thereof. Also, in the above embodiment, the alignment mark cover parts 54 cover the alignment chips C2. Instead, the alignment mark cover parts 54 may cover the chips C1 to be products, though the chips C1 to be products are useless.

Moreover, in the above embodiment, the alignment marks are formed at the insulating film on the semiconductor substrate. When a wiring pattern is formed at the upper wiring layer, the alignment marks are formed at the interlaid insulating film between the under wiring layer and the upper wiring layer.

In addition, the material for metal wiring is not limited to aluminum, but may be tungsten, titanium, or the like.

We claim:

1. A semiconductor device fabrication method comprising the steps of:

(a) forming an insulating layer on a semiconductor substrate;

(b) forming separately from one another, patterns for chips to be products and for alignment chips each having contact holes and at least four alignment marks, by exposing and developing the insulating layer by means of a stepping aligning method wherein a first mask having a mask pattern which corresponds to one of the chips to be products and includes contact holes and at least four alignment marks, is used, each of the patterns for the alignment chips being positioned in the peripheral part of the semiconductor substrate and being partially left out from the semiconductor substrate whereby a chip resulting therefrom is incapable of functioning as a chip to be product;

(c) covering the alignment marks in the patterns for the alignment chips with alignment-mark covering means;

(d) depositing a metal film on the insulating layer; and (e) aligning a second mask having a mask pattern for wiring, based on the alignment marks in the alignment chips on which no metal film is deposited.

2. The semiconductor device fabrication method according to claim 1, wherein at least four alignment chips are formed.

3. The semiconductor device fabrication method according to claim 1, wherein the mask pattern of the first mask includes four alignment marks, and the four alignment marks of the mask pattern of the first mask are provided in corners of the mask pattern, respectively.

4. The semiconductor device fabrication method according to claim 1, wherein each of the patterns for the alignment chips has three alignment marks.

5. The semiconductor device fabrication method according to claim 1, wherein each of the alignment marks in the patterns for the chips to be products is provided in a region at which a scribe-line is to be provided.

6. The semiconductor device fabrication method according to claim 1, further comprising:

a step of detecting an orientation flat in the semiconductor substrate and moving the semiconductor substrate such that the alignment-mark covering means is set over the alignment marks in the patterns for the alignment chips, said step being conducted before said step of depositing a metal film and after said step of covering the alignment marks in the patterns for the alignment chips.

7. The semiconductor device fabrication method according to claim 1, wherein said step of depositing a metal film is carried out by a sputtering method.

8. The semiconductor device fabrication method according to claim 1, wherein said step of depositing a metal film is carried out by a chemical vapor deposition method.

9. The semiconductor device fabrication method according to claim 1, wherein the metal film is composed of aluminum.

\* \* \* \* \*